United States Patent
Bogner et al.

(10) Patent No.: US 8,331,746 B2
(45) Date of Patent: Dec. 11, 2012

(54) ILLUMINATION UNIT COMPRISING LUMINESCENCE DIODE CHIP AND OPTICAL WAVEGUIDE, METHOD FOR PRODUCING AN ILLUMINATION UNIT AND LCD DISPLAY

(75) Inventors: Georg Bogner, Lappersdorf (DE); Herbert Brunner, Sinzing (DE); Stefan Gruber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/992,975

(22) PCT Filed: Sep. 22, 2006

(86) PCT No.: PCT/DE2006/001687
§ 371 (c)(1),
(2), (4) Date: Aug. 6, 2009

(87) PCT Pub. No.: WO2007/036207
PCT Pub. Date: Apr. 5, 2007

(65) Prior Publication Data
US 2009/0297090 A1    Dec. 3, 2009

(30) Foreign Application Priority Data

Sep. 30, 2005  (DE) .......................... 10 2005 047 064
Nov. 2, 2005   (DE) .......................... 10 2005 052 356

(51) Int. Cl.
    *G02B 6/26*    (2006.01)
(52) U.S. Cl. ........................................... 385/50; 385/14
(58) Field of Classification Search .................... 385/14, 385/50
    See application file for complete search history.

(56) References Cited

U.S. PATENT DOCUMENTS

| 4,729,185 | A |   | 3/1988  | Baba            |        |
|-----------|---|---|---------|-----------------|--------|
| 4,762,381 | A | * | 8/1988  | Uemiya et al.   | 385/88 |
| 5,027,258 | A |   | 6/1991  | Schöniger et al.|        |
| 5,618,096 | A |   | 4/1997  | Parker et al.   |        |
| 5,684,309 | A |   | 11/1997 | McIntosh et al. |        |
| 5,831,277 | A |   | 11/1998 | Razeghi         |        |
| 5,876,107 | A |   | 3/1999  | Parker et al.   |        |
| 5,894,196 | A |   | 4/1999  | McDermott       |        |
| 6,350,041 | B1|   | 2/2002  | Tarsa et al.    |        |

(Continued)

FOREIGN PATENT DOCUMENTS

CN          2391269         8/2000

(Continued)

OTHER PUBLICATIONS

I. Schnitzer et al., "30% quantum efficiency from surface textured, thin-film light-emitting diodes", Appl. Phys. Letter, vol. 63, No. 16, pp. 2174-2176, Oct. 18, 1993.

(Continued)

*Primary Examiner* — Sarah Hahm
(74) *Attorney, Agent, or Firm* — Cozen O'Connor

(57) ABSTRACT

An illumination unit comprising a luminescence diode chip mounted on a chip carrier and comprising an optical waveguide is specified. The optical waveguide is joined together from at least two separate parts, wherein the luminescence diode chip is encapsulated by one of the parts of the optical waveguide. A method for producing a luminescence diode chip of this type and also an LCD display comprising an illumination unit of this type are furthermore specified.

27 Claims, 4 Drawing Sheets

U.S. PATENT DOCUMENTS

| | | | |
|---|---|---|---|
| 6,616,862 B2 | 9/2003 | Srivastava et al. | |
| 6,647,199 B1 * | 11/2003 | Pelka et al. | 385/146 |
| 6,749,312 B2 * | 6/2004 | Parker et al. | 362/618 |
| 6,758,582 B1 | 7/2004 | Hsiao et al. | |
| 6,961,190 B1 * | 11/2005 | Tamaoki et al. | 359/726 |
| 7,064,480 B2 | 6/2006 | Bokor et al. | |
| 7,431,480 B2 * | 10/2008 | Godo | 362/311.06 |
| 7,942,565 B2 * | 5/2011 | Klick et al. | 362/610 |
| 2002/0192477 A1 | 12/2002 | Honda et al. | |
| 2003/0094893 A1 | 5/2003 | Ellens et al. | |
| 2003/0095399 A1 | 5/2003 | Grenda | |
| 2004/0042233 A1 | 3/2004 | Suzuki | |
| 2004/0062699 A1 | 4/2004 | Oshio | |
| 2004/0264188 A1 | 12/2004 | Tazawa et al. | |
| 2005/0129957 A1 | 6/2005 | Kashiwagi et al. | |
| 2005/0151141 A1 | 7/2005 | Grotsch et al. | |
| 2007/0008734 A1 * | 1/2007 | Bogner et al. | 362/509 |
| 2011/0180824 A1 * | 7/2011 | Tan et al. | 257/89 |

FOREIGN PATENT DOCUMENTS

| | | |
|---|---|---|
| CN | 2391289 | 8/2000 |
| DE | 25 10 267 | 9/1975 |
| DE | 36 02 819 | 7/1986 |
| DE | 100 36 940 | 2/2002 |
| DE | 101 47 040 | 4/2003 |
| EP | 0 403 764 A1 | 12/1990 |
| EP | 0 945 673 | 3/1999 |
| EP | 1 434 277 | 6/2004 |
| EP | 1 503 434 A2 | 2/2005 |
| JP | 62-176883 | 11/1987 |
| JP | 62-257119 | 11/1987 |
| JP | 5-038627 | 5/1993 |
| JP | 11-053919 A | 2/1999 |
| JP | 2004-47358 | 2/2004 |
| JP | 2005-136427 A | 5/2005 |
| TW | 512215 | 12/2002 |
| TW | I232603 | 5/2005 |
| WO | WO 00/33390 | 6/2000 |

OTHER PUBLICATIONS

English Translation of an Office Action issued on Apr. 2, 2012 in the corresponding Japanese Application No. 2008-532590.

* cited by examiner

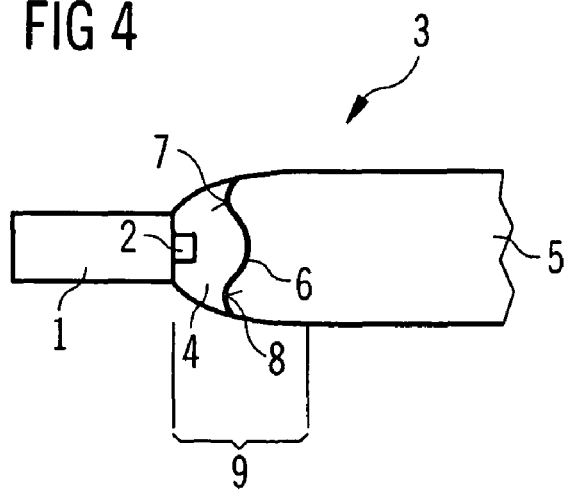
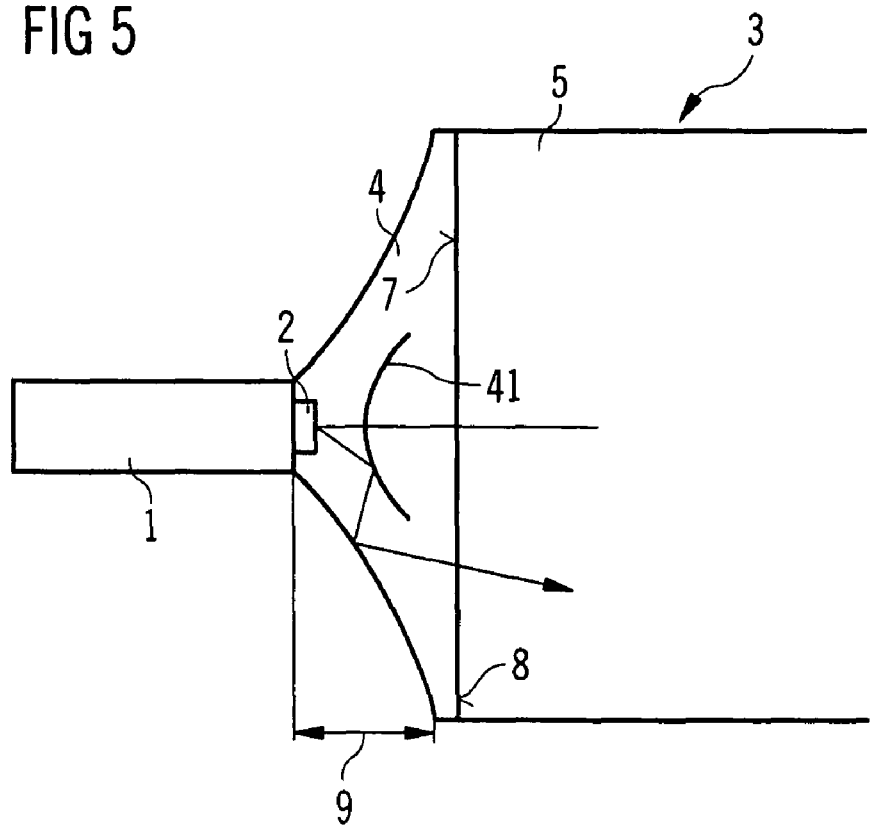

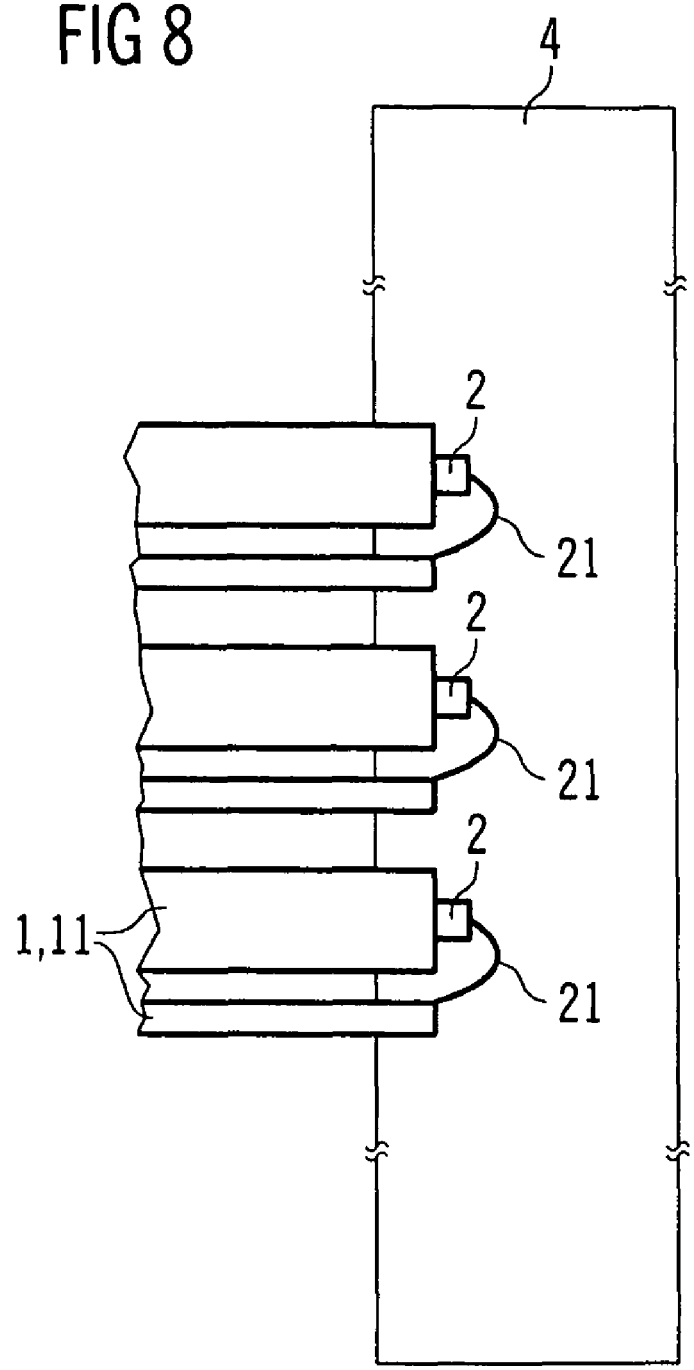

ILLUMINATION UNIT COMPRISING LUMINESCENCE DIODE CHIP AND OPTICAL WAVEGUIDE, METHOD FOR PRODUCING AN ILLUMINATION UNIT AND LCD DISPLAY

RELATED APPLICATIONS

This is a U.S. national stage of application No. PCT/DE2006/001687, filed on Sep. 22, 2006.

This patent application claims the priority of German patent applications 102005052356.0 and 102005047064.5, the disclosure content of which is hereby incorporated by reference.

FIELD OF THE INVENTION

The invention relates to an illumination unit comprising a luminance diode chip and an optical waveguide. It furthermore relates to an LCD display comprising an illumination unit of this type, and to a method for producing an illumination unit of this type.

BACKGROUND OF THE INVENTION

Illumination units for LCD displays comprising luminescence diode chips generally have a plurality of prefabricated luminescence diode chip components within which a luminescence diode chip is respectively enclosed by housing material. The optical waveguide is present as a separate part. It is positioned relative to the luminescence diode component in such a way that light coupled out from the component impinges on a coupling-in area of the optical waveguide.

A precise alignment of the optical waveguide relative to the luminescence diode chip of the luminescence diode component is technically complicated. Moreover, reflection losses occur in the course of coupling into the optical waveguide at the coupling-in area.

SUMMARY OF THE INVENTION

It is an object of the present invention to provide an illumination unit of the type mentioned in the introduction which, compared with conventional luminous units, enables improved coupling of light into the optical waveguide and in which more precise alignment of the optical waveguide relative to the luminescence diode chip is possible. The intention is also to specify an LCD display and a method for producing the illumination unit.

According to the invention, the luminescence diode chip is mounted on a chip carrier and encapsulated by a part of the optical waveguide. Chip carrier, luminescence diode chip and at least the part of the optical waveguide that encapsulates the luminance diode chip are thus formed as one unit.

By virtue of the fact that the optical waveguide does not have to be aligned relative to a luminescence diode component, but rather is molded around the luminescence diode chip, optical waveguide and luminescence diode chip can be aligned more precisely with one another. Moreover, reflection losses in the course of coupling light into the optical waveguide can be significantly reduced as a result.

Furthermore, with this approach, an additional housing material for the luminescence diode chip and a possible additional mount for the optical waveguide can advantageously be dispensed with. By integrating the luminescence diode chip into the optical waveguide, it is advantageously possible to realize particularly flat illumination units, which is striven for particularly in the case of a use for LCD displays.

In the context of the present application, an optical waveguide should be understood to mean dielectric optical waveguides, in the dielectric body of which the light is guided by utilizing total reflection at outer areas of the body.

The optical waveguide is advantageously joined together from a plurality of separate parts, preferably from two separate parts. It is also possible, in principle, to form the optical waveguide from a single homogenous electrical body. However, joining together the optical waveguide from a plurality of separate parts affords advantages during the production of the illumination unit. The separate part that encapsulates the luminescence diode chip can advantageously be produced separately, independently of further parts of the optical waveguide.

The part of the optical waveguide that encapsulates the luminescence diode chip advantageously has reflective outer areas of the optical waveguide. The separate parts of the optical waveguide are preferably constituted and joined together in such a way that reflective outer areas of the optical waveguide are joined to one another in the region of edges of the separate parts.

Preferably, the separate part of the optical waveguide that encapsulates the luminescence diode chip is formed from a different material than a further part of the optical waveguide.

Advantageously, the separate parts of the optical waveguide are joined together by means of adhesive. For this purpose it is possible to use a transparent adhesive, the refractive index of which is expediently adapted to that of the separate parts of the optical waveguide, such that the refractive index jumps in the beam path are kept as small as possible. Reflection losses at interfaces can largely be avoided as a result. As an alternative, it is also possible for the separate parts of the optical waveguide to be joined together by means of plugging together or further suitable methods.

Preferably, the optical waveguide, in particular the part of the optical waveguide that molds around the luminescence diode chip, has a thermosetting plastic. Forming an optical waveguide or a part of the optical waveguide by means of a thermosetting plastic is relatively expensive compared with the use of a thermoplastic. On the other hand, when using a thermoplastic it is technically more complicated to mold the optical waveguide around a luminescence diode chip or onto a luminescence diode chip. This is because it contracts upon curing and can thereby deform or can damage the luminescence diode chip.

In addition or as an alternative to a thermosetting plastic, the optical waveguide preferably comprises at least one thermoplastic and/or at least one silicone. Particularly preferably, the waveguide comprises a mixed material comprising at least one thermosetting plastic and at least one silicone.

In accordance with a further embodiment, the separate parts of the optical waveguide have connecting areas via which they are connected to one another. The connecting areas advantageously have an alignment structure by means of which they are aligned with one another. When the separate parts are joined together, the alignment structures preferably intermesh in such a way that the separate parts are guided by them and are aligned with one another in an envisaged manner.

A coupling-out area of the separate part that encapsulates the luminescence diode chip particularly advantageously has a lens-shaped curvature or lens like structure. If a further separate part of the optical waveguide is joined to said coupling-out area of the optical waveguide, then it preferably has a different refractive index than the part that encapsulates the luminescence diode chip. As a result, light in the optical waveguide can be not just guided but more extensively influenced in an advantageous manner. The light can be for example collimated, focused or else deflected in another preferred direction.

The optical waveguide preferably has a collimating section for reducing the divergence of coupled-in light. Said collimating section is expediently arranged at that side of the optical waveguide which faces the luminescence diode chip. With a collimating section of this type, the light emitted by the luminescence diode chip can be collimated even at great proximity thereto, whereby it is possible to realize low-divergents light bundles having a high luminance.

The collimating section advantageously has a cross-sectional area that increases in the light guiding direction, wherein the cross-sectional area respectively extends perpendicular to the optical axis of the optical waveguide or of the collimating section.

In addition or as an alternative, the collimating section is formed in the manner of a non-imaging optical concentrator that is provided for through-radiation in the opposite direction compared with a customary use of a concentrator. The use of the collimating section formed in this way means that the divergence of the light emitted by the luminescence diode chip can advantageously be reduced in an efficient manner.

Particularly preferably, the collimating section is formed in the manner of a CPC, CEC or CHC. These abbreviations are understood to mean here and hereinafter concentrators whose reflective side walls at least partly and/or at least extensively have the form of a compound parabolic concentrator (CPC), of a compound elliptic concentrator (CEC) and/or of a compound hyperbolic concentrator (CHC).

As an alternative, the collimating section advantageously has outer areas on which direct connecting lines run substantially straight from the beginning to the end of the collimating section. Particularly preferably, the collimating section is in this case formed in the manner of a truncated cone or truncated pyramid, wherein the truncated pyramid can be not only a quadrangular but also a triangular, pentagonal or polygonal truncated pyramid.

In accordance with a further preferred embodiment of the illumination unit, two connecting areas of separate parts of the optical waveguide are arranged in the collimating section. It is advantageous for the separate part of the optical waveguide that encapsulates the luminescence diode chip to be kept as short as possible. If this is produced by means of transfer molding or injection molding, for example, then it is thereby possible to significantly increase the number of encapsulated luminescence diode chips that can be produced simultaneously, and to save production costs.

A deflection element is advantageously formed in the collimating section of the optical waveguide in the interior thereof, said deflection element deflecting light in the direction of outer areas of the optical waveguide. A coupled-in light cone can be expanded by a deflection element of this type in order for example that an optical waveguide whose cross section is considerably larger than a light emission area of the luminescence diode chip is illuminating as homogenously as possible.

In one expedient embodiment, the chip carrier has a leadframe. It can in particular also consist of a leadframe. Preferably, the luminescence diode chip is mounted on the chip carrier in such a way that its main emission direction runs substantially parallel to the main extension plane of the leadframe.

The luminescence diode chip is particularly advantageously applied to an end face of the leadframe. The illumination unit can be made particularly thin by virtue of this measure.

Particularly preferably, the illumination unit is suitable for the backlighting of an LCD display. A particularly efficient backlighting of displays can be achieved with an illumination unit formed in this way for LCD displays.

In accordance with a further particularly preferred embodiment, the illumination unit comprises a plurality of luminescence diode chips that are jointly encapsulated by a separate part of the optical waveguide. As an alternative, the illumination unit has a plurality of luminescence diode chips and a plurality of parts of the optical waveguide that encapsulate the luminescence diode chips.

The illumination unit has, in particular, a single optical waveguide, but it can also comprise a plurality of optical waveguides.

An LCD display comprising an illumination unit according to the invention is specified.

Furthermore, a method for producing an illumination unit is specified. In one method step of the method, a chip carrier and at least one luminescence diode chip are provided. In a further method step, the luminescence diode chip is mounted on the chip carrier. The method additionally comprises forming at least one part of an optical waveguide by encapsulating the luminescence diode chip with a transparent composition.

In accordance with a particularly preferred embodiment of the method, in a further method step, at least one further part of the optical waveguide is joined to the part that encapsulates the luminescence diode chip. The joining of the further part of the optical waveguide is preferably effected by means of adhesive bonding.

Preferably, in the method, a plurality of luminescence diode chips are encapsulated substantially simultaneously with the transparent composition. The luminescence diode chips are mounted either on a common chip carrier or on two or more separate chip carriers. The mounting of the luminescence diode chip comprises both a mechanical and an electrical mounting of the luminescence diode chip.

Encapsulating the luminescence diode chip is particularly preferably effected by means of transfer molding or injection molding.

BRIEF DESCRIPTION OF THE DRAWINGS

Further advantages, preferred embodiments and developments of the illumination unit, of the LCD display and of the method for producing an illumination unit will become apparent from the exemplary embodiments explained below in conjunction with FIGS. 1 to 8, in which:

FIG. 4 shows a schematic sectional view of a fourth exemplary embodiment of the illumination unit, FIG. 5 shows a schematic sectional view of a fifth exemplary embodiment of the illumination unit, FIG. 8 shows a schematic sectional view of an eighth exemplary embodiment of the illumination unit.

DETAILED DESCRIPTION OF THE DRAWINGS

Figure 1:
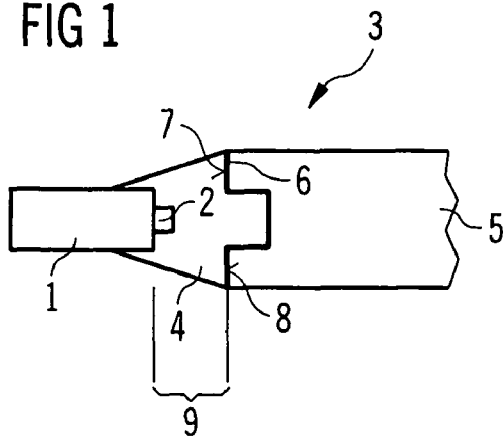
FIG. 1 shows a schematic sectional view of a first exemplary embodiment of the illumination unit.

In the exemplary embodiments and figures, identical or identically acting constituent parts are in each case provided with the same reference symbols. The constituent parts illustrated and also the size relationships of the constituent parts among one another should not be regarded as true to scale. Rather, some details of the figures are illustrated with an exaggerated size in order to afford a better understanding.

The illumination units illustrated in FIGS. 1 to 8 all have a chip carrier 1. The latter comprises a leadframe, for example, on which at least one luminescence diode chip 2 is mounted. Electrical connection pads of the luminescence diode chip 2 are electrically conductively connected to the leadframe.

The luminescence diode chip 2 is arranged for example on an end face of the leadframe that extends substantially perpendicular to a main extension plane of the leadframe. In order that there is space for the luminescence diode chip on the end face of the leadframe, the leadframe has e.g. a thickness of greater than or equal to 0.3 mm, preferably of greater than or equal to 0.5 mm. The luminescence diode chip 2 is mounted in such a way that its main emission direction is substantially or completely parallel to the main extension plane of the leadframe.

In the exemplary embodiment illustrated in FIG. 8, the luminescence diode chips are mounted by an area remote from their emission direction on end faces of a leadframe 11 of the carrier 1. On a coupling-out area remote from the leadframe, the luminescence diode chips 2 have electrical contact regions that are electrically conductively connected to electrical connection conductors of the leadframe 11 by means of a bonding wire 21.

The luminescence diode chip is particularly preferably a thin-film luminescence diode chip. A thin-film luminescence diode chip is distinguished in particular by the following characteristic features:
- a reflective layer is applied or formed at a first main area—facing toward a carrier element—of a radiation-generating epitaxial layer sequence, said layer reflecting at least part of the electromagnetic radiation generated in the epitaxial layer sequence back into the latter;
- the epitaxial layer sequence has a thickness in the region of 20 μm or less, in particular in the region of 10 μm; and
- the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

By way of example, the chip carrier itself can also serve as the carrier element, that is to say that the epitaxial layer sequence can be applied directly on the chip carrier.

The epitaxial layer sequence is preferably completely or partly free of a growth substrate. A basic principle of a thin-film luminescence diode chip is described for example in I. Schnitzer et al., Appl. Phys. Lett. 63 (16), 18 Oct. 1993, 2174-2176, the disclosure content of which in this respect is hereby incorporated by reference.

The epitaxial layer sequence is based for example on nitride compound semiconductor materials and is suitable for emitting an electromagnetic radiation from the blue and/or ultraviolet spectrum. Nitride compound semiconductor materials are compound semiconductor materials containing nitrogen, such as materials from the system $In_xAl_yGa_{1-x-y}N$ where $0 \leq x \leq 1$, $0 \leq y \leq 1$ and $x+y \leq 1$. The epitaxial layer sequence has e.g. at least one semiconductor layer composed of a nitride compound semiconductor material.

The epitaxial layer sequence can contain for example a conventional pn junction, a double heterostructure, a single quantum well structure (SQW structure) or a multiple quantum well structure (MQW structure). Such structures are known to the person skilled in the art and are therefore not explained in any greater detail at this juncture. Examples of such MQW structures are described in the documents U.S. Pat. No. 5,831,277 and 5,684,309, the disclosure content of which in this respect is hereby incorporated by reference.

The luminescence diode chip is provided e.g. with a luminescence conversion material having at least one phosphor. The phosphor can be excited by the electromagnetic primary radiation emitted by the luminescence diode chip and emits a secondary radiation, wherein the primary radiation and the secondary radiation have different wavelength ranges. A desired resulting color locus of the component can be set for example by setting a mixing ratio of the primary radiation and secondary radiation. The setting is effected e.g. by way of the quantity of phosphor that is used.

In principle, all phosphors known for the application in LEDs are suitable for the use in the luminescence conversion material. Examples of such phosphors and phosphor mixtures suitable as converters are:
- chlorosilicates as disclosed for example in DE 10036940 and the prior art described therein,
- orthosilicates, sulfides, thiometals and vanadates as disclosed for example in WO 2000/33390 and the prior art described therein,
- aluminates, oxides, halophosphates as disclosed for example in U.S. Pat. No. 6,616,862 and the prior art described therein,
- nitrides, siones and sialones as disclosed for example in DE 10147040 and the prior art described therein, and
- garnets of the rare earths such as YAG:Ce and the alkaline earth metal elements as disclosed for example in US 2004-062699 and the prior art described therein.

In the exemplary embodiments, the illumination unit has an optical waveguide 3, which is connected directly to the luminescence diode chip 2 or to material applied on the luminescence diode chip 2. It is thereby possible to obtain an optimum coupling of the light emitted by the luminescence diode chips 2 into the optical waveguide 3.

The optical waveguide 3 is for example joined together from a plurality of separate parts 4, 5, see FIGS. 1 to 7. It comprises a first part 4, which encapsulates the luminescence diode chip 2. Preferably, the luminescence diode chip 2 is completely encapsulated by the first part 4 of the optical waveguide 3. Consequently, the optical waveguide 3 simultaneously also protects the luminescence diode chip 2 against external influences. A separate housing or a possible additional housing material is not necessary.

The process of forming the first parts 4 of the optical waveguide 3 and the process of encapsulating the luminescence diode chip 2 are effected by means of an injection method of molding, for example by means of transfer molding. The material used is for example a transparent plastic, which is preferably a thermosetting plastic such as a suitable epoxy resin, for example. The carrier 1 with the luminescence diode chip 2 mounted thereon is placed into a suitable transfer mold and the luminescence diode chip and a part of the carrier 1 are encapsulated by means of transfer molding. As a result, the first part 4 of the optical waveguide 3 is molded onto the carrier and the luminescence diode chip 2. Preferably, a plurality of luminescence diode chips are mounted on the carrier in a line, for example.

In this way it is also possible to produce the entire optical waveguide 3 in one method step. It is preferred, however, to produce a further part of the optical waveguide 3 separately and to join it together with the first part 4 by means of adhesive bonding, for example. The further part 5 of the optical waveguide 3 can therefore be produced for example from a different material and also by means of a different method than the first part 4 that encapsulates the luminescence diode chip.

The further part 5 is produced from a thermoplastic, for example. Suitable materials are PMMI, PMMA, polycarbonate or polysulfone, for example. Production can be effected by means of injection molding, for example. Alternative materials for the parts of the optical waveguide are silicones or mixed materials.

Appropriate mixed materials include silicone-modified epoxy resins, for example, which age to a lesser extent than conventional epoxy resins upon the action of ultraviolet light, but for the rest essentially have the positive physical properties of conventional epoxy resins. It is also possible to mix at least one epoxy resin and at least one silicone with one another. Examples of suitable mixed materials of this type are specified for example in US 2002/0192477 A1 or in US 2005/0129957 A1, the disclosure content of which in this respect is hereby incorporated by reference. By mixing different materials, a refractive index of the mixed material can also be set in a targeted manner, such that the refractive indexes of different materials can be coordinated with one another or it is possible to realize refractive index jumps between the different parts of the optical waveguide 3 in a targeted manner.

Suitable adhesives for joining together separate parts of the optical waveguide 3 are for example adhesives based on epoxy resin and/or silicone. Prior to the joining-together process, connecting areas of the parts 4, 5 of the optical waveguide 3 are surface-treated, in particular roughened, in order to ensure a reliable and permanent connection and in order to prevent delamination and the formation of air gaps between the parts of the optical waveguide.

In the exemplary embodiments illustrated in FIGS. 1 to 7, the first part 4 and the further part 5 of the optical waveguide 3 are connected to one another via the coupling-out area 7 of the first part 4 and the coupling-in area 8 of the second part 5 of the optical waveguide 3, that is to say that the coupling-out area 7 and the coupling-in area 8 serve as connecting areas. These areas preferably have alignment structures by means of which the parts 4, 5 are aligned with one another, see FIGS. 1 to 4.

In the exemplary embodiment illustrated in FIG. 1, the coupling-out area 7 of the first part 4 of the optical waveguide 3 has an angular projection as alignment structure, which engages into a corresponding angular cutout of the second part 5 of the optical waveguide 3, such that the two separate parts 4, 5 of the optical waveguide 3 are aligned with one another.

Figure 2:
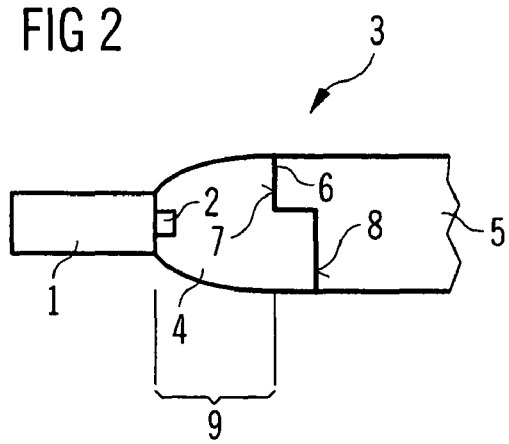
FIG. 2 shows a schematic sectional view of a second exemplary embodiment of the illumination unit.

In the exemplary embodiment illustrated in FIG. 2, the coupling-out area 7 and the coupling-in area 8 of the separate parts 4, 5 have a step. They are formed in such a way that they engage in one another with an accurate fit. The connecting areas have partial areas which extend substantially perpendicular to an optical axis of the illumination unit. A further partial area of the respective connecting areas extends in the region of the step substantially parallel to the optical axis of the illumination unit. As an alternative, however, said area could also run obliquely with respect to the optical axis of the illumination unit or of the optical waveguide.

Figure 3:
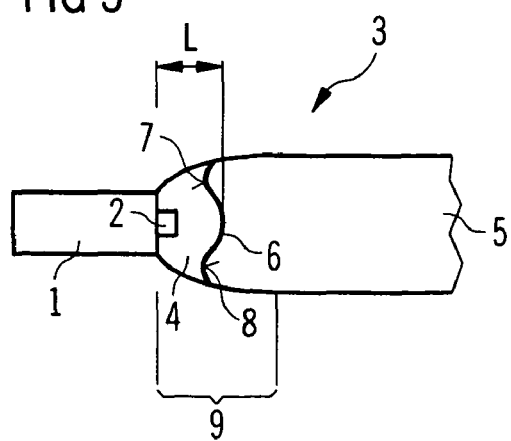
FIG. 3 shows a schematic sectional view of a third exemplary embodiment of the illumination unit.

In the exemplary embodiment illustrated in FIG. 3, the alignment structures of the connecting areas comprise convex and concave curvatures. They are in turn formed in such a way that the two separate parts of the optical waveguide 3 engage in one another with an accurate fit.

The exemplary embodiment illustrated in FIG. 4 also comprises curvatures at the connecting areas. The coupling-out area 7 of the first part 4 has in the center a convex curvature in the manner of a condenser lens. In this exemplary embodiment, the second part 5 of the optical waveguide 3 is formed from a material having a lower refractive index than the material from which the first part 4 of the optical waveguide 3 is formed. Consequently, the curvature of the coupling-out area 7 of the first part 4 acts like a condenser lens in the interior of the optical waveguide 3.

The adhesive 6 between the separate parts 4, 5 of the optical waveguide 3 has a refractive index that is equal to that of the first part 4 or equal to that of the first part 5 or has a value lying between the refractive indexes of the first part 4 and of the second part 5 of the optical waveguide 3.

In the exemplary embodiments illustrated in FIGS. 1 to 7, the optical waveguide 3 has collimating sections 9. The latter reduce the divergence of the light that is generated by the luminescence diode chips 2 and is coupled into the optical waveguide 3. The collimating sections 9 all have a cross-sectional area that increases in the light guiding direction, the cross-sectional area being measured perpendicular to the optical axis of the illumination unit.

The collimating sections 9 are formed for example in the manner of a non-imaging optical concentrator. The section that follows the collimating section 9 in the light guiding direction has for example a substantially constant cross section. The optical waveguide generally has e.g. at least one section in which the main extension planes of two mutually opposite outer areas of the optical waveguide extend parallel to one another.

In the exemplary embodiment illustrated in FIG. 1, the collimating section 9 of the optical waveguide has the form of a truncated cone or of a truncated pyramid.

In the exemplary embodiment illustrated in FIGS. 2 to 4 and 6, the collimating sections 9 have outer areas that are convexly curved in section along the light guiding direction. Said collimating sections 9 are formed in the manner of a CPC, for example. By virtue of this form, a particularly effective reduction of the divergence of the light coupled into the optical waveguide 3 can be obtained and the light can be collimated.

In the exemplary embodiment illustrated in FIG. 5, the collimating section 9 has concavely curved outer areas (as seen in section along the light guiding direction, as illustrated in FIG. 5). In this exemplary embodiment, a deflection element 41 is formed in the collimating section 9, said deflection element being used to deflect electromagnetic radiation from the interior of the optical waveguide 3 to the outer areas thereof. The light is deflected in particular to the concavely curved outer areas of the collimating region 9.

As a result of the reflections at the deflection element 41 and at the concavely curved outer areas of the collimating region 9, the light is collimated and distributed homogeneously over the entire cross section of the optical waveguide 3.

The light is reflected at the deflection element 41 by means of total reflection, for example, that is to say that the deflection element has a medium having a significantly lower refractive index than the rest of the collimating section 9.

Such an embodiment of the deflection element 41 also has the effect that light having a lower angle of incidence than the critical angle of total reflection is partly transmitted by the deflection element 41.

The deflection element 41 can for example comprise a cavity within the optical waveguide or consist of such a cavity. In order to improve the optical properties, inner walls of the cavity can be partly or completely provided with a coating. The form of the cavity is chosen in such a way that a desired deflection property is obtained. The path of two light beams within the optical waveguide 3 is indicated by way of example by arrows in FIG. 5. In the exemplary embodiment illustrated in FIG. 5, the hollow body of the deflection element has a convex curvature on the side facing the luminescence diode chip, which is indicated by a correspondingly curved line.

Figure 6:
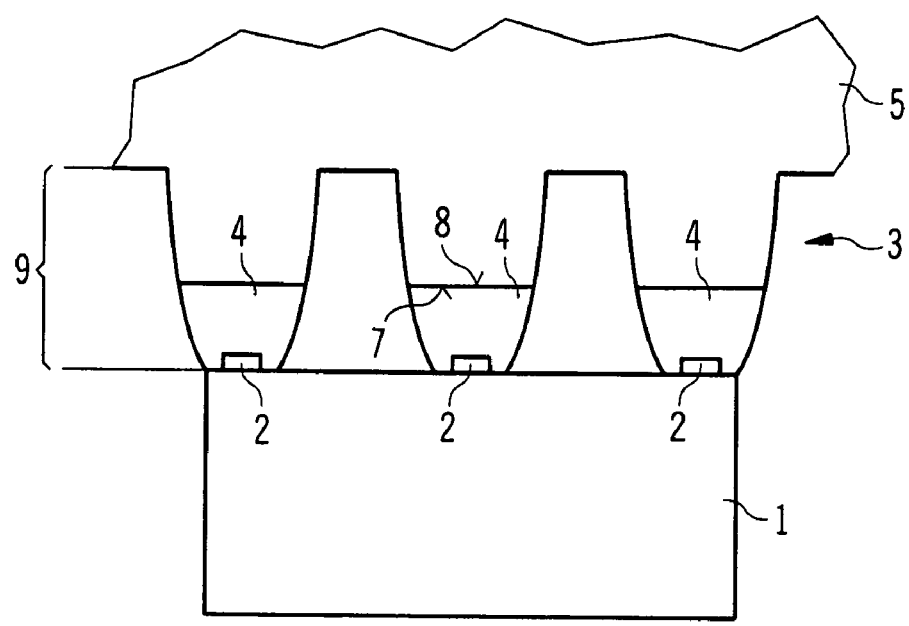
FIG. 6 shows a schematic sectional view of a sixth exemplary embodiment of the illumination unit.

In the exemplary embodiments illustrated in FIGS. 3, 4 and 6, two connecting areas 7, 8 of separate parts 4, 5 of the optical waveguide 3 are arranged in the collimating section 9. In other words, the collimating section 9 is not arranged completely in a single separate part of the optical waveguide, rather it extends over two separate parts.

By virtue of the fact that the length L (see FIG. 3) of the part 4 of the optical waveguide 3 that encapsulates the luminescence diode chip 2 is kept as short as possible, a cost-optimized production of the illumination unit can be obtained. This is due to the fact that different materials and different production methods can be used for different separate parts. While generally more complicated production methods and expensive materials are necessary for encapsulating the luminescence diode chip, it is possible to have recourse to move favorable materials and to more favorable production methods for the production of further parts of the optical waveguide 3. Moreover, it is technically simpler to mold only a smallest possible part directly onto the carrier and the luminescence diode chip 2 instead of molding a larger part of the optical waveguide 3 or the entire optical waveguide 3 directly on the carrier 1 and the luminescence diode chip 2.

Figure 7:
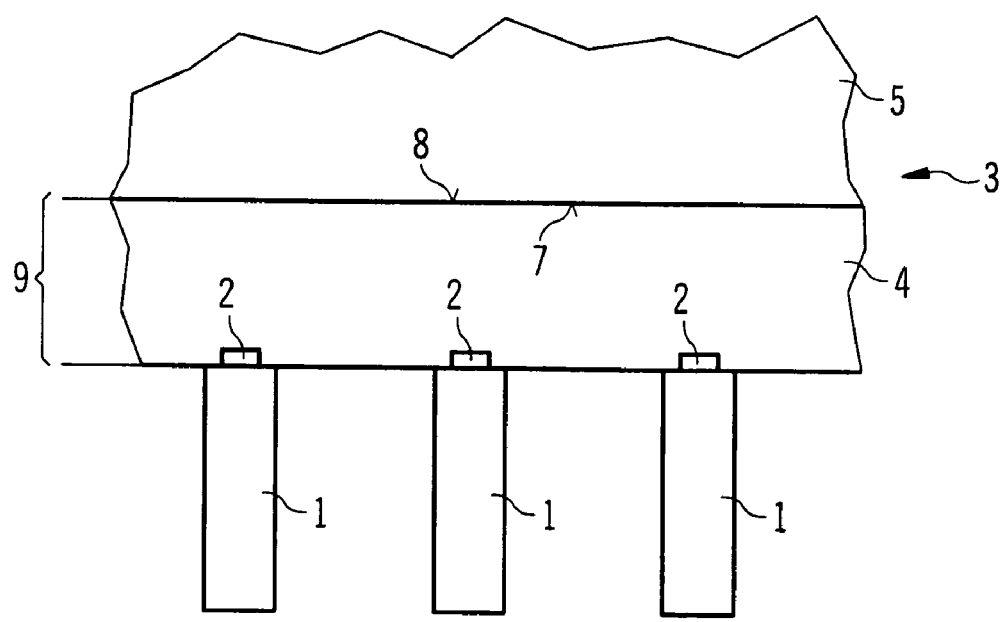
FIG. 7 shows a schematic sectional view of a seventh exemplary embodiment of the illumination unit.

In the exemplary embodiments illustrated in FIGS. 6, 7 and 8, the illumination unit has a plurality of luminescence diode chips 2. The latter are mechanically and electrically mounted on a common chip carrier 1 in the exemplary embodiment illustrated in FIG. 6. However, they can also be mounted on different chip carriers 1, as is the case in the exemplary embodiments illustrated in FIGS. 7 and 8.

The illumination units illustrated in FIGS. 6 to 8 are suitable for the backlighting of an LCD display. The illumination unit illustrated in FIG. 6 has a plurality of separate parts 4 of the optical waveguide 3 by means of which in each case a single luminescence diode chip 2 is encapsulated. As an alternative, in this example, it is also possible for in each case a plurality of luminescence diode chips to be encapsulated by one of the separate first parts 4 of the optical waveguide 3. The plurality of first separate parts 4 of the optical waveguide 3 is connected for example to a single further part 5 of the optical waveguide 3. Said further part is formed for example substantially in plate-type fashion.

In the exemplary embodiment illustrated in FIG. 7, the illumination unit has a plurality of luminescence diode chips 2 encapsulated by a single first part 4 of the optical waveguide 3. This is the case for example also in the exemplary embodiment illustrated in FIG. 8.

In the illumination units for LCD displays, bare chips are mounted to form an array, wherein the array can comprise for example up to 50 luminescence diode chips. Illumination units having approximately 20 to 50 chips could be used in monitors, for example, while for example 1 to 6 luminescence diode chips are used in LCD displays for mobile phone applications. All of the luminescence diode chips are preferably encapsulated simultaneously by one or by a plurality of optical waveguides 3, which is preferably done by using an injection method of molding and a suitable injection mold.

The invention is not restricted to the exemplary embodiments by the description of the invention on the basis of said exemplary embodiments. Rather, the invention encompasses any new feature and also the combination of features, which in particular comprises any combination of features in the patent claims, even if this feature or only this combination itself is not explicitly specified in the patent claims or exemplary embodiments.

The invention claimed is:

1. An illumination unit comprising a luminescence diode chip mounted on a chip carrier and comprising an optical waveguide, wherein the optical waveguide is joined together from first and second separate parts and the luminescence diode chip is directly connected to and encapsulated by the first separate part of the optical waveguide, wherein the first separate part of the optical waveguide that encapsulates the luminescence diode chip has side areas that extend in a light guiding direction of the optical waveguide, and wherein said side areas are completely reflective, wherein connecting areas of the first and second separate parts of the optical waveguide via which the latter are connected to one another have an alignment structure by means of which they are aligned with one another, and wherein the alignment structure has a step-like structure, and wherein the step-like structure is asymmetric with respect to a longitudinal axis of the illumination unit.

2. The illumination unit as claimed in claim 1, wherein the first and the second separate parts of the optical waveguide are joined together by means of adhesive.

3. The illumination unit as claimed in claim 1, wherein the first separate part of the optical waveguide that encapsulates the luminescence diode chip is formed from a different material than the second separate part of the optical waveguide.

4. The illumination unit as claimed in claim 1, wherein the first separate part of the optical waveguide that encapsulates the luminescence diode chip comprises a thermosetting plastic, a silicone or a mixed material comprising at least one thermosetting plastic and at least one silicone.

5. The illumination unit as claimed in claim 4, wherein the first separate part of the optical waveguide that encapsulates the luminescence diode chip comprises a mixed material comprising at least one epoxy resin and at least one silicone.

6. The illumination unit as claimed in claim 1, wherein a coupling-out area of the first separate part that encapsulates the luminescence diode chip has a lens-shaped curvature or lens like structures.

7. The illumination unit as claimed in claim 1, wherein the optical waveguide has a collimating section for reducing the divergence of coupled-in light, the reflective side areas being part of the collimating section.

8. The illumination unit as claimed in claim 7, wherein the collimating section has a cross-sectional area that increases in the light guiding direction.

9. The illumination unit as claimed in claim 7, wherein the collimating section is formed in the manner of a non-imaging optical concentrator that is provided for through-radiation in the opposite direction compared with a customary use of a concentrator.

10. The illumination unit as claimed in claim 9, wherein the collimating section is formed in the manner of a CPC, CEC or CHC.

11. The illumination unit as claimed in claim 7, wherein the collimating section is formed in the manner of a truncated cone or truncated pyramid.

12. The illumination unit as claimed in claim 7, wherein two connecting areas of the first and second separate parts of the optical waveguide are arranged in the collimating section.

13. The illumination unit as claimed in claim 7, wherein a deflection element is arranged in the collimating section, said deflection element deflecting light in the interior of the optical waveguide in the direction of the outer areas thereof.

14. The illumination unit as claimed in claim 1, wherein the chip carrier has a leadframe.

15. The illumination unit as claimed in claim 14, wherein the luminescence diode chip is mounted on the chip carrier in such a way that its main emission direction runs substantially parallel to the main extension plane of the leadframe.

16. The illumination unit as claimed in claim 14, wherein the luminescence diode chip is mounted on an end side of an electrical conductor of the leadframe.

17. The illumination unit as claimed in claim 1, wherein the illumination unit is suitable for the backlighting of an LCD display.

18. The illumination unit as claimed in claim 1, which has a plurality of luminescence diode chips which are jointly encapsulated by the first separate part of the optical waveguide.

19. The illumination unit as claimed in claim 1, which has a plurality of luminescence diode chips and a plurality of first separate parts of the optical waveguide that encapsulate the luminescence diode chips.

20. An LCD display comprising an illumination unit as claimed in claim 1.

21. The illumination unit as claimed in claim 1, wherein the first separate part of the optical waveguide comprises a silicone material.

22. The illumination unit as claimed in claim 1, wherein the first and the second separate parts of the optical waveguide comprise at least two different materials.

23. The illumination unit as claimed in claim 1, wherein the first separate part of the optical waveguide comprises a silicone material, and wherein the first and the second separate parts of the optical waveguide comprise at least two different materials.

24. A method for producing an illumination unit comprising the steps of:
providing a chip carrier and a luminescence diode chip, mounting the luminescence diode chip on the chip carrier,
forming a first part of an optical waveguide by directly applying a transparent composition to the luminescence diode chip, wherein side areas of the first part of the optical waveguide extend in a light guiding direction of the optical waveguide, and wherein said side areas are completely reflective, and
connecting connecting areas of the first and a second separate part of the optical waveguide via which the latter are connected to one another, the connecting areas having an alignment structure by means of which they are aligned with one another, wherein the alignment structure has a step-like structure, and wherein the step-like structure is symmetric with respect to a longitudinal axis of the illumination unit.

25. The method as claimed in claim 24, wherein at least one further part of the optical waveguide is joined to the first part that encapsulates the luminescence diode chip.

26. The method as claimed in claim 25, wherein the further part of the optical waveguide is joined by means of adhesive bonding.

27. The method as claimed in claim 24, wherein encapsulating the luminescence diode chip comprises transfer molding or injection molding.

* * * * *